United States Patent
Sharma et al.

(10) Patent No.: US 9,490,781 B2
(45) Date of Patent: Nov. 8, 2016

(54) REDUNDANT CLOCK TRANSITION TOLERANT LATCH CIRCUIT

(71) Applicant: NXP B.V., Eindhoven (NL)

(72) Inventors: Vibhu Sharma, Eindhoven (NL); Ajay Kapoor, Veldhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/265,097

(22) Filed: Apr. 29, 2014

(65) Prior Publication Data

US 2015/0123723 A1 May 7, 2015

(51) Int. Cl.
*H03K 3/356* (2006.01)
*H03K 3/3562* (2006.01)
*H03K 3/037* (2006.01)
*H03K 3/012* (2006.01)

(52) U.S. Cl.
CPC .......... *H03K 3/35625* (2013.01); *H03K 3/012* (2013.01); *H03K 3/0372* (2013.01); *H03K 3/356104* (2013.01); *H03K 3/356156* (2013.01)

(58) Field of Classification Search
None
See application file for complete search history.

(56) References Cited

U.S. PATENT DOCUMENTS

| | | | |
|---|---|---|---|
| 3,651,340 A | 3/1972 | Cliff | |
| 4,584,491 A | 4/1986 | Ulmer | |
| 7,187,211 B2 * | 3/2007 | Lundberg | H03K 19/0963 327/215 |
| 7,456,669 B2 | 11/2008 | Teh et al. | |
| 7,479,806 B2 | 1/2009 | Teh et al. | |
| 7,518,426 B1 | 4/2009 | Smith | |
| 8,085,076 B2 | 12/2011 | Djaja et al. | |
| 2002/0000834 A1 | 1/2002 | Ooishi | |
| 2002/0130693 A1 | 9/2002 | Kojima et al. | |
| 2003/0117933 A1 * | 6/2003 | Hsu | H03K 3/356139 369/200 |
| 2005/0242859 A1 | 11/2005 | Meltzer et al. | |
| 2006/0044013 A1 | 3/2006 | Hsu et al. | |
| 2006/0267654 A1 | 11/2006 | Gururajarao et al. | |
| 2007/0182458 A1 * | 8/2007 | Park | G11C 7/065 327/51 |
| 2008/0007312 A1 | 1/2008 | Clark et al. | |
| 2008/0030238 A1 | 2/2008 | Kim | |
| 2009/0085627 A1 | 4/2009 | Gill et al. | |
| 2010/0271866 A1 | 10/2010 | Sakimura et al. | |
| 2013/0002328 A1 | 1/2013 | Oda | |
| 2015/0043270 A1 * | 2/2015 | Singh | G11C 11/416 365/154 |

FOREIGN PATENT DOCUMENTS

JP 60224319 11/1985

OTHER PUBLICATIONS

European Search Report, 13191288.3, Feb. 26, 2014.
European Search Report, 15159813.3, Jun. 1, 2015.
(Continued)

*Primary Examiner* — Long Nguyen

(57) ABSTRACT

Embodiments of a latch circuit and a method of operating a latch circuit are described. In one embodiment, a latch circuit includes an input terminal configured to receive an input data signal, a switching unit configured to control application of the input data signal, a first inverter circuit connected to the switching unit, where the first inverter circuit includes a first cross-coupled pair of inverters, and a second inverter circuit connected to the first inverter circuit through the switching unit. The second inverter circuit includes a second cross-coupled pair of inverters and two transistor devices. Each inverter of the second cross-coupled pair of inverters is connected to a voltage rail through a corresponding transistor device. Each of the two transistor devices is connected to a node that is between the switching unit and the first inverter circuit or the second inverter circuit. Other embodiments are also described.

20 Claims, 10 Drawing Sheets

(56) References Cited

OTHER PUBLICATIONS

Teh, Chen Kong et al.; "A 77% Energy-Saving 22-Transistor Single-Phase Clocking D flip-flop with Adaptive Coupling Configuration in 40nm CMPS"; ISSCC 2011 Session 19, Lo-Power Digital Techniques, 19.4; IEEE International Solid State Circuits Conference; pp. 338-339; Feb. 23, 2011.
European Search Report, 13191288.3, Mar. 6, 2014.
European Search Report, 15159813.3, Oct. 1, 2015.

* cited by examiner

REDUNDANT CLOCK TRANSITION TOLERANT LATCH CIRCUIT

This application claims priority from European Patent Application No. EP13191288, filed Nov. 1, 2013, which is incorporated herein by reference in its entirety.

Embodiments of the invention relate generally to electronic hardware and methods for operating electronic hardware, and, more particularly, to latch circuits and methods for operating latch circuits.

The power consumption of an electronic circuit is an important performance metric. For example, for low power embedded devices such as microcontrollers and smartcards, reducing the power consumption is important to the performance of the device. Dynamic power consumption caused by redundant clock transitions of digital devices can account for a significant portion of the overall power consumption of digital devices. Specifically, charging and discharging of internal nodes of a latch circuit in which the input data of the latch circuit is in the same state for consecutive clock cycles result in unnecessary power consumption. For example, dynamic power consumption caused by redundant clock transitions can account for around 50% of the power consumption of a latch circuit. The reduction in power consumption by redundant clock transitions can reduce the overall power consumption of a latch circuit and improve the power efficiency of the latch circuit. Therefore, it is desirable to reduce power consumption caused by redundant clock transition in a latch circuit.

Embodiments of a latch circuit and a method of operating a latch circuit are described. In one embodiment, a latch circuit includes an input terminal configured to receive an input data signal, a switching unit configured to control application of the input data signal, a first inverter circuit connected to the switching unit, where the first inverter circuit includes a first cross-coupled pair of inverters, and a second inverter circuit connected to the first inverter circuit through the switching unit. The second inverter circuit includes a second cross-coupled pair of inverters and two transistor devices. Each inverter of the second cross-coupled pair of inverters is connected to a voltage rail through a corresponding transistor device. Each of the two transistor devices is connected to a node that is between the switching unit and the first inverter circuit or the second inverter circuit. The latch circuit implements data aware power gating to reduce or eliminate dynamic power consumption caused by redundant clock transitions within the latch circuit. Other embodiments are also described.

In an embodiment, a latch circuit includes an input terminal configured to receive an input data signal, a switching unit configured to control application of the input data signal, a first inverter circuit connected to the switching unit, where the first inverter circuit includes a first cross-coupled pair of inverters, and a second inverter circuit connected to the first inverter circuit through the switching unit. The second inverter circuit includes a second cross-coupled pair of inverters and two transistor devices. Each inverter of the second cross-coupled pair of inverters is connected to a voltage rail through a corresponding transistor device. Each of the two transistor devices is connected to a node that is between the switching unit and the first inverter circuit or the second inverter circuit.

In an embodiment, a latch circuit includes an input terminal configured to receive an input data signal, a switching unit, a first inverter circuit, and a second inverter circuit. The switching unit includes a first inverter configured to generate an inverted version of the input data signal from the input data signal, a second inverter connected to the first inverter and configured to generate a non-inverted version of the input data signal, a first set of switching transistors of a first polarity type, where the first set of switching transistors are connected to the first and second inverters and a second set of switching transistors of a second, opposite, polarity type. The first inverter circuit is connected to the first and second sets of switching transistors and includes a first cross-coupled pair of inverters. The second inverter circuit is connected to the first inverter circuit through the second set of switching transistors. The second inverter circuit includes a second cross-coupled pair of inverters and two transistor devices. Each inverter of the second cross-coupled pair of inverters is connected to a low voltage rail and to a high voltage rail through a corresponding transistor device. Gate terminals of the two transistor devices are cross-connected to drain terminals or source terminals of the second set of switching transistors.

In an embodiment, a method for operating a latch circuit involves receiving input data at the latch circuit and discharging or charging input nodes of a cross-coupled pair of inverters of the latch circuit if the input data is different for consecutive clock cycles of the latch circuit.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
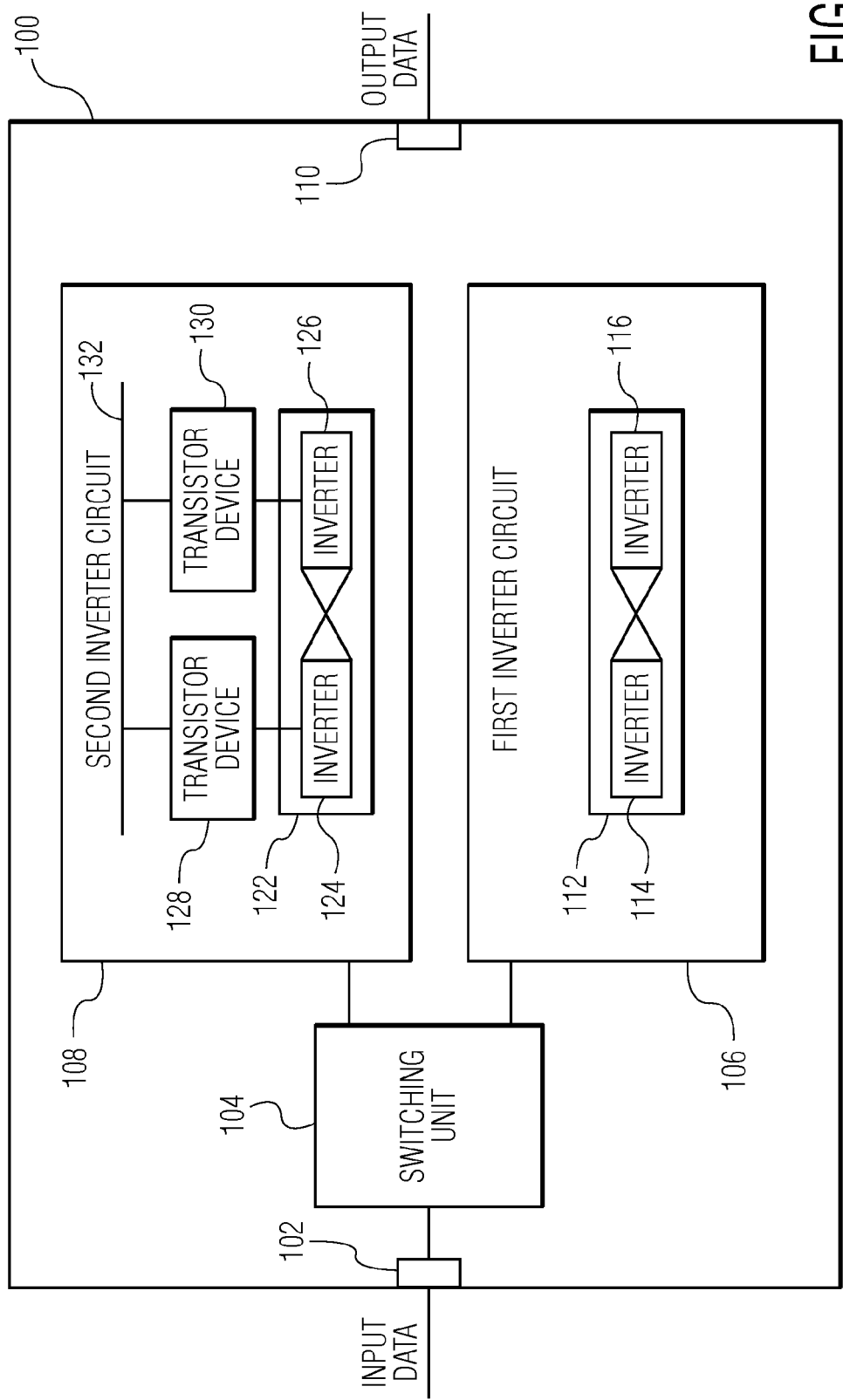
FIG. 1 is a schematic block diagram of a latch circuit in accordance with an embodiment of the invention.

FIG. 1 is a schematic block diagram of a latch circuit 100 in accordance with an embodiment of the invention. In the embodiment depicted in FIG. 1, the latch circuit includes an input terminal 102, a switching unit 104, a first inverter circuit 106, a second inverter circuit 108, and an output terminal 110. The latch circuit can be used in various applications, such as automotive applications, communications applications, industrial applications, medical applications, computer applications, and/or consumer or appliance applications. The latch circuit can be implemented in a substrate, such as a semiconductor wafer or a printed circuit board (PCB). In an embodiment, the latch circuit is included in a low power system-on-chip (SoC). For example, the latch circuit may be included in a low power cryptographic SoC. Although the latch circuit is shown in FIG. 1 as including certain components, in some embodiments, the latch circuit includes less or more components to implement less or more functionalities. For example, the latch circuit may include a clock source or a voltage source.

The input terminal 102 of the latch circuit 100 is configured to receive an input data signal. The output terminal 110 of the latch circuit is configured to output an output data signal in response to the input data signal.

The switching unit 104 of the latch circuit 100 is configured to control application of the input data signal. In some embodiments, the switching unit controls application of the input data signal to the first inverter circuit and to the second inverter circuit. The switching unit may include a first set of switches that includes transistors of a first polarity type and a second set of switches that includes transistors of a second, opposite, polarity type.

The first inverter circuit 106 of the latch circuit 100 is connected to the switching unit 104 and includes a first cross-coupled pair 112 of inverters 114, 116. A cross-coupled pair of inverters is also referred to as a cross-coupled inverter pair (CCIP). The second inverter circuit 108 of the latch circuit is connected to the first inverter circuit through the switching unit. The second inverter circuit includes a second cross-coupled pair 122 of inverters 124, 126, and at least two transistor devices 128, 130. In some embodiments, each inverter of the second cross-coupled pair of inverters is connected to a voltage rail 132 through a corresponding transistor device 128 or 130. The voltage rail may have a positive voltage. Alternatively, the voltage rail may be connected to the ground. In these embodiments, each of the two transistor devices is connected to a node that is between the switching unit and the first inverter circuit or the second inverter circuit. In some embodiments, the first inverter circuit 106 is a master inverter circuit and the second inverter circuit 108 is a slave inverter circuit. In these embodiments, a change in state of the first inverter circuit causes a change in state of the second inverter circuit.

Latch circuits, such as a Master-Slave D-type flip-flop, a "clock on demand" flip-flop, and a master slave flip-flop, as described in European Patent Application No. EP13191288, use clock gating to turn off the clocking of the portion of the latch circuit that is not in use. However, clock gating can be ineffective for situations in which the data sampled by the clocked element is identical for two consecutive clock cycles. The redundant switching of the internal nodes of a latch circuit caused by the clock signal, when the input data at the input terminal 102 is in the same state for consecutive clock cycles, may cause an unnecessary increase in the power consumption (e.g., un necessary charging and discharging of internal node parasitic capacitances). In the embodiment depicted in FIG. 1, input data aware power gating can be implemented by connecting each of the two transistor devices 128, 130 to a node that is between the switching unit 104 and the first inverter circuit 112 or the second inverter circuit 122. Compared to other retention latch circuits, the latch circuit 100 depicted in FIG. 1 exhibits reduced power consumption, eliminates extra control signals, and reduces area overhead due to redundant switching by input data aware power gating. In addition, compared to other latch circuits, the latch circuit depicted in FIG. 1 does not require an internal clock-buffer. Further, compared to other latch circuits, the latch circuit depicted in FIG. 1 can use single phase clocking, and therefore does not need internal clock signal inversion. The latch circuit depicted in FIG. 1 can be implemented with low power, with no dynamic power consumption for redundant transitions when the input data signal and the output data signal are the same.

Figure 2:
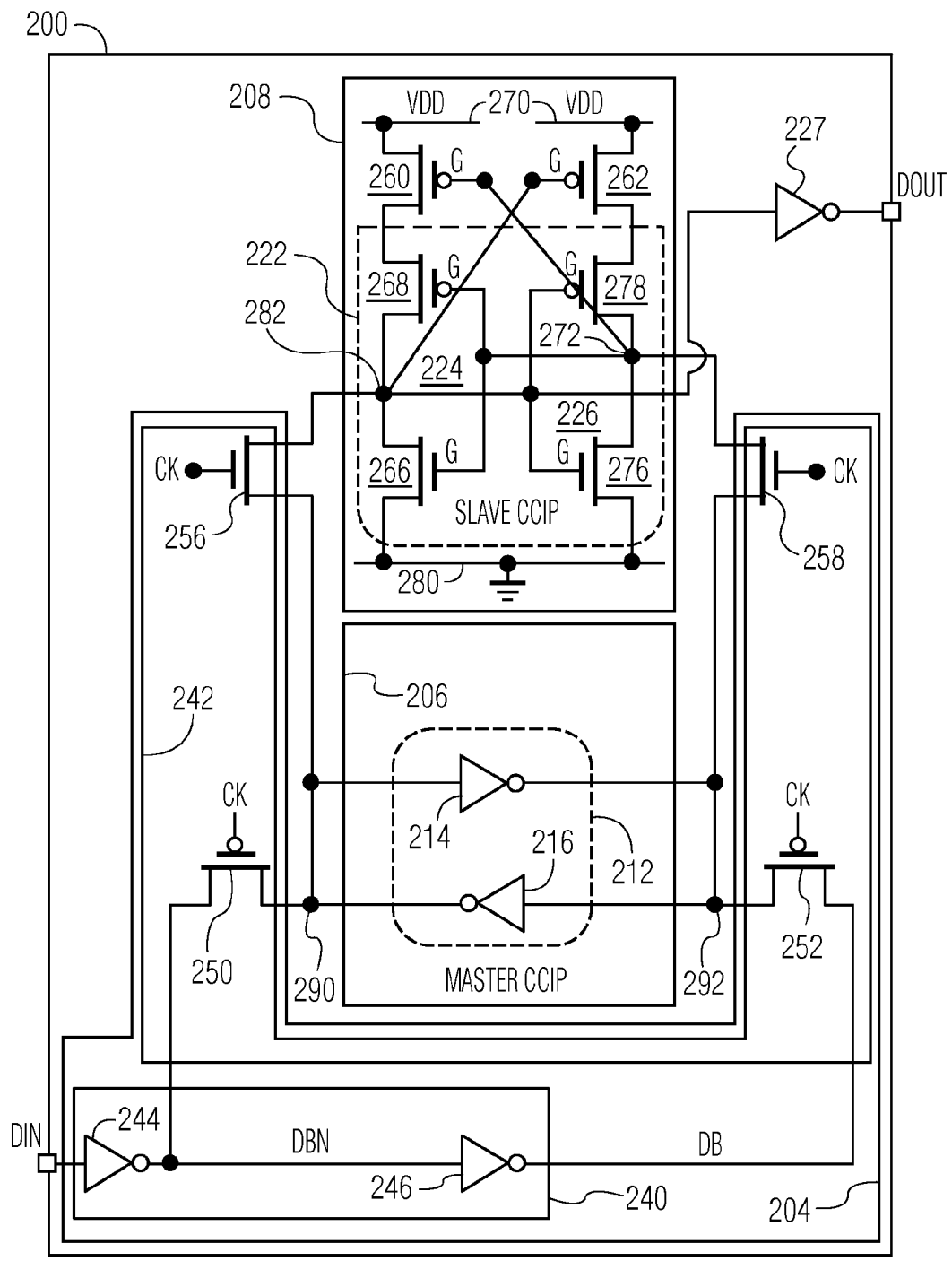
FIG. 2 depicts an embodiment of the latch circuit depicted in FIG. 1.

In some embodiments, gate terminals of the two transistor devices 128, 130 of the second inverter circuit 108 are cross-connected to nodes between the switching unit 104 and the second cross-coupled pair of inverters 122. FIG. 2 depicts an embodiment of the latch circuit 100 depicted in FIG. 1 in which gate terminals, "G," of two transistor devices 260, 262 of a slave inverter circuit 208 are cross-connected to nodes 282, 272 between a switching unit 204 and a cross-coupled inverter pair (CCIP) 222 (referred to as the slave CCIP) of the slave inverter circuit. In the embodiment depicted in FIG. 2, a latch circuit 200 includes an input terminal, "DIN," the switching unit 204, a master inverter circuit 206 having a cross-coupled inverter pair (CCIP) 222 (referred to as the master CCIP), the slave inverter circuit 208 having the slave CCIP 222, an inverter 227, and an output terminal, "DOUT." A change in state of the master inverter circuit causes a change in state of the slave inverter circuit. In the embodiment depicted in FIG. 2, input data aware power gating is implemented for the slave inverter circuit 208. The latch circuit 200 depicted in FIG. 2 is one possible embodiment of the latch circuit 100 depicted in FIG. 1. However, the latch circuit 100 depicted in FIG. 1 is not limited to the embodiment shown in FIG. 2.

In an embodiment, the input terminal, "DIN," is configured to receive an input data signal. The output terminal, "DOUT," is configured to output an output data signal in response to the input data signal.

The switching unit 204, which includes an inverter circuit 240 and a switching module 242, is configured to control the application of the input data signal received from the input terminal, "DIN," to inverters 214, 216 of the master CCIP 212 and to inverters 224, 226 of the slave CCIP 222. The inverter circuit 240 is configured to generate an inverted version, "DBN," of the input data signal and a non-inverted version, "DB," of the input data signal. In the embodiment depicted in FIG. 2, the inverter circuit 240 includes inverters 244, 246. The inverter 244 is connected to the input terminal, "DIN," and is configured to generate the inverted version, "DBN," of the input data signal. The inverter 246 is configured to generate the non-inverted version, "DB," of the input data signal. The switching module 242 is configured to switch either the inverted version, "DBN," or the non-inverted version, "DB," of the input data signal to an input terminal of the master CCIP 212 or the slave CCIP 222 and to switch the other one of the inverted and non-inverted versions of the input data signal to an output terminal of the master CCIP 212 or the slave CCIP 222. In the embodiment depicted in FIG. 2, the switching module includes a first set of switches that are implemented as PMOS transistors 250, 252, and a second set of switches that are implemented as NMOS transistors 256, 258. The transistor 250 is configured to switch the inverted version, "DBN," of the input data signal to an input terminal 290 of the master CCIP 212. The transistor 252 is configured to switch the non-inverted version, "DB," of the input data signal to an output terminal 292 of the master CCIP 212. The transistor 256 is configured to switch the inverted version, "DBN," of the input data signal to an input terminal 282 of the slave CCIP 222. The transistor 258 is configured to switch the non-inverted version, "DB," of the input data signal to an output terminal 272 of the slave CCIP 222.

The master inverter circuit 206 includes the master CCIP 212, which includes inverters 214, 216. The inverters 214, 216 are connected back-to-back. As shown in FIG. 2, the output terminal of the inverter 214 is connected to the input terminal of the inverter 216, while the output terminal of the inverter 216 is connected to the input terminal of the inverter 214.

The slave inverter circuit 208 is connected to the master inverter circuit 206 through the switching unit 204. In the embodiment depicted in FIG. 2, the slave inverter circuit includes the slave CCIP 222 with the inverters 224, 226 and two transistor devices 260, 262 that are implemented as PMOS transistors. The inverter 224 includes an NMOS transistor 266 and a PMOS transistor 268 connected in series with each other. Gate terminals, "G," of the NMOS transistor 266 and the PMOS transistor 268 are connected to a source terminal or drain terminal of the NMOS transistor 258. The PMOS transistor 260 is connected to a high voltage rail 270 with a positive voltage, "VDD," and to the inverter 224. The inverter 226 includes an NMOS transistor 276 and a PMOS transistor 278 connected in series with each other. Gate terminals, "G," of the NMOS transistor 276 and the PMOS transistor 278 are connected to a source terminal or drain terminal of the NMOS transistor 256. The PMOS transistor 262 is connected to the high voltage rail 270 with the positive voltage, "VDD," and to the inverter 226. The transistors 266, 276 are connected to a low voltage rail 280 that is connected to ground. In the embodiment depicted in FIG. 2, PMOS transistors 260, 268 are stacked together while PMOS transistors 262, 278 are stacked together. Stacked PMOS transistors in the slave inverter circuit helps to mitigate leakage current. In the embodiment depicted in FIG. 2, input data aware power gating is implemented using floating power gating for the slave inverter circuit. Specifically, the gate terminal, "G," of the PMOS transistor 262 is connected to the node 282 that is connected to the NMOS transistor 256 and the gate terminal, "G," of the PMOS transistor 260 is connected to a node 272 that is connected to the NMOS transistor 258. The latch circuit 200 enables relaxed transistor sizes because the floating connection of the slave CCIP to the voltage rail 270 that is dependent on the input data of the latch circuit can facilitate and accelerate the overpowering of the state of the slave CCIP 222. Compared to other latch circuits, the latch circuit depicted in FIG. 2 does not require internal clock signal inversion. Absence of an internal clock inverter pair reduces unnecessary power consumption caused by the redundant clock transitions in which the input data remains the same for consecutive clock cycles of the clock signal, "CK," because all the internal charging and discharging of the capacitances of the latch circuit 200 occur when the input data of the latch circuit 200 changes.

Figure 3:
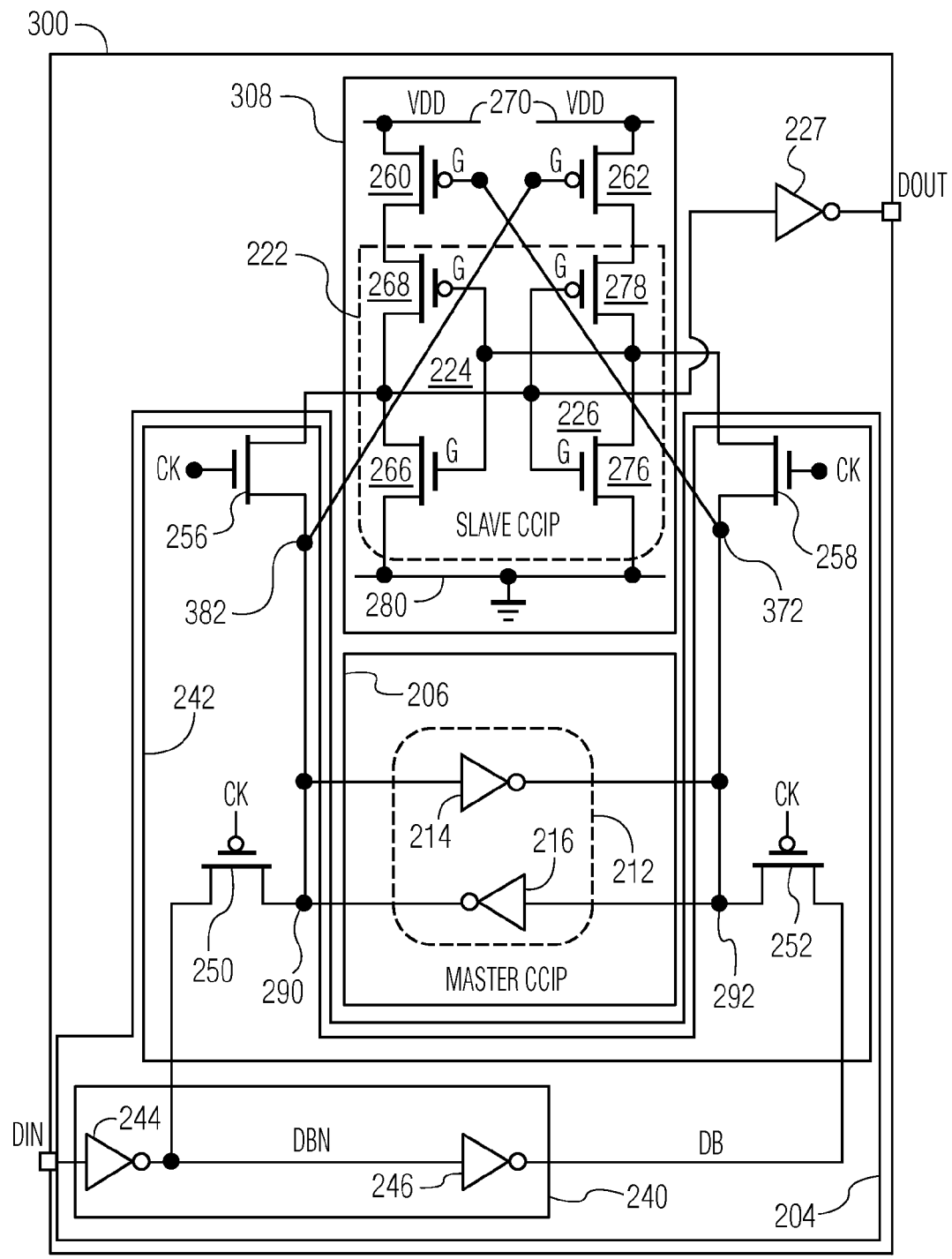
FIG. 3 depicts another embodiment of the latch circuit depicted in FIG. 1.

Turning back to FIG. 1, in some embodiments, input data aware power gating is implemented for the slave inverter circuit 108 in which gate terminals of the two transistor devices 128, 130 are cross-connected to nodes between two switches of the switching unit 104 and the first cross-coupled pair of inverters 112. FIG. 3 depicts an embodiment of the latch circuit 100 depicted in FIG. 1 in which gate terminals of the two transistor devices 260, 262 of a slave inverter circuit 308 are cross-connected to nodes between a switching unit 204 and a cross-coupled inverter pair (CCIP) 222 (referred to as the slave CCIP) of the slave inverter circuit 308. In the embodiment depicted in FIG. 3, a latch circuit 300 includes the input terminal, "DIN," the switching unit 204, a master inverter circuit 206 having a master CCIP 212, the slave inverter circuit 308 having the slave CCIP 222, the inverter 227, and the output terminal, "DOUT." The difference between the latch circuit 300 depicted in FIG. 3 and the latch circuit 200 depicted in FIG. 2 is the connections of the floating gate terminals, "G," of the PMOS transistors 260, 262. In the embodiment depicted in FIG. 3, input data aware power gating is implemented using floating power gating for the slave CCIP 222. Specifically, the gate terminal, "G," of the PMOS transistor 260 is connected to a node 372 that is connected to the NMOS transistor 258 and the inverters 214, 216 of the master inverter circuit while the gate terminal, "G," of the PMOS transistor 262 is connected to a node 382 that is connected to the NMOS transistor 256 and the inverters 214, 216 of the master inverter circuit. The latch circuit 300 enables relaxed transistor sizes because of the floating connection of the slave CCIP to the voltage rail 270 dependent on the input data of the latch circuit can facilitate and accelerate the overpowering of the state of the slave CCIP 222. Compared to other latch circuits, the latch circuit depicted in FIG. 3 does not require an internal clock signal inversion, which reduces unnecessary power consumption caused by the redundant clock transitions.

Figure 4:
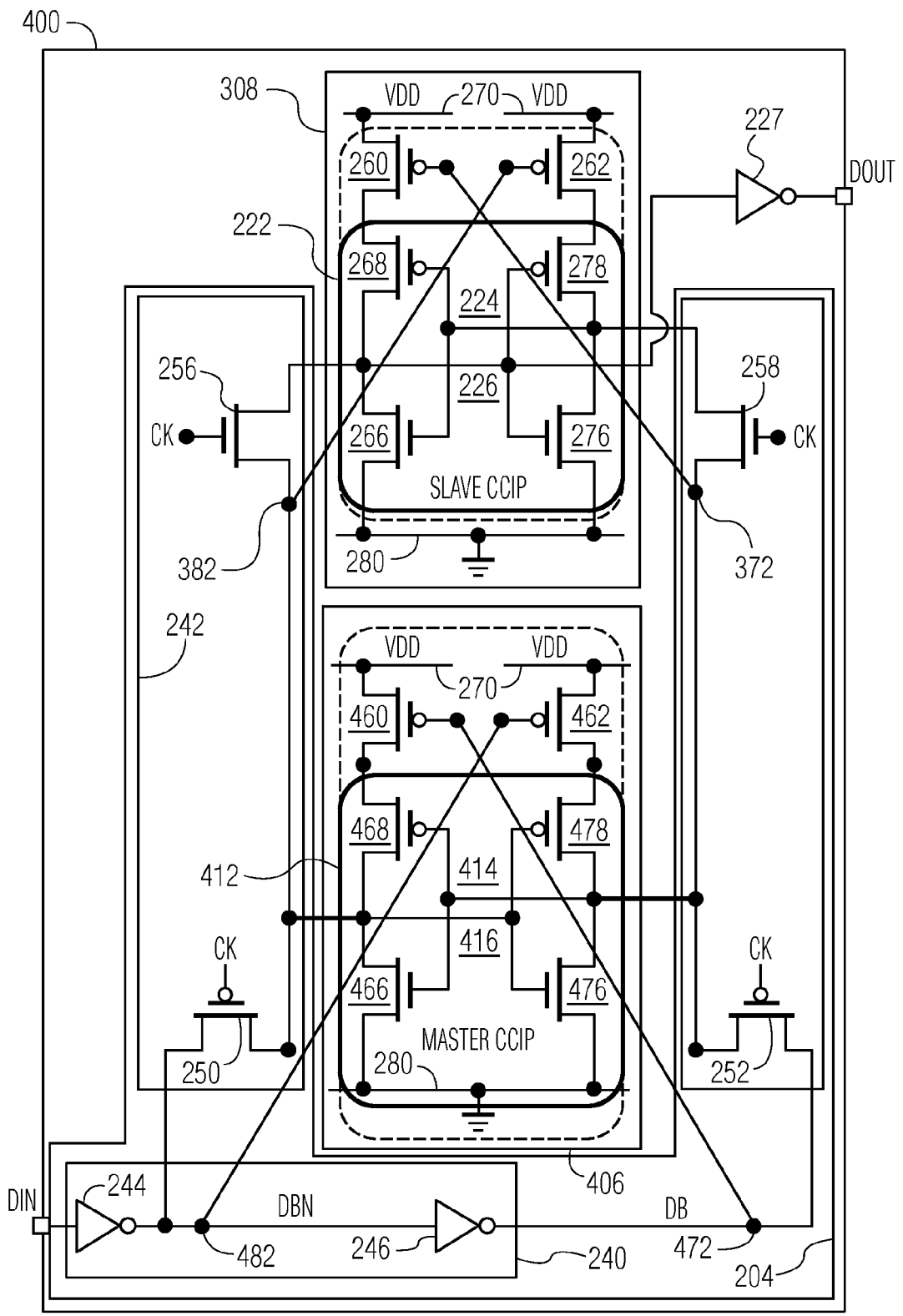
FIG. 4 depicts another embodiment of the latch circuit depicted in FIG. 1.

Turning back to FIG. 1, in some embodiments, input data aware power gating is implemented for both the slave inverter circuit 108 and the master inverter circuit 106. FIG. 4 depicts an embodiment of the latch circuit 100 depicted in FIG. 1 in which input data aware power gating is implemented for a slave inverter circuit 308 and the master inverter circuit 406. In the embodiment depicted in FIG. 4, the latch circuit 400 includes the input terminal, "DIN," the switching unit 204, the master inverter circuit 406 having a master CCIP 412, the slave inverter circuit 308 having a slave CCIP 222, the inverter 227, and the output terminal, "DOUT." In the embodiment depicted in FIG. 4, the master inverter circuit 406 includes the cross-coupled pair 412 of inverters 414, 416 and two transistor devices 460, 462 that are implemented as PMOS transistors. The inverter 414 includes an NMOS transistor 466 and a PMOS transistor 468 connected in series with each other. Gate terminals, "G," of the NMOS transistor 466 and the PMOS transistor 468 are connected to a source terminal or drain terminal of the PMOS transistor 252. The PMOS transistor 460 is connected to the high voltage rail 270 with the positive voltage, "VDD," and to the inverter 414. The inverter 416 includes an NMOS transistor 476 and a PMOS transistor 478 connected in series with each other. Gate terminals, "G," of the NMOS transistor 476 and the PMOS transistor 478 are connected to a source terminal or drain terminal of the PMOS transistor 250. The PMOS transistor 462 is connected to the high voltage rail 270 with the positive voltage, "VDD," and to the inverter 416. The transistors 466, 476 are connected to a low voltage rail 280 that is connected to the ground. In the embodiment depicted in FIG. 4, PMOS transistors 460, 468 are stacked together while PMOS transistors 462, 478 are stacked together. Stacked PMOS transistors in the slave inverter circuit and the master inverter circuit helps to mitigate the leakage current. In the embodiment depicted in FIG. 4, input data aware power gating is implemented using floating power gating for slave cross-coupled inverters and master cross-coupled inverters. Specifically, the gate terminal, "G," of the PMOS transistor 460 is connected to a node 472 at the output of the inverter 246 that is connected to the PMOS transistor 252, while the gate terminal of the PMOS transistor 462 is connected to a node 482 at the output of the inverter 244 that is connected to the PMOS transistor 250. In the latch circuit depicted in FIG. 4, the internal nodes (e.g., DBN, DB) of the latch circuit are discharged or charged only when the input data received at the input terminal, "DIN," is different for consecutive clock cycles of the clock signal, "CK." Compared to other latch circuits, the latch circuit depicted in FIG. 4 does not require internal clock signal inversion. The absence of an internal clock inverter pair reduces unnecessary power consumption caused by redundant clock transitions in which the input data remains the same for consecutive clock cycles of the clock signal, "CK."

Figure 5:
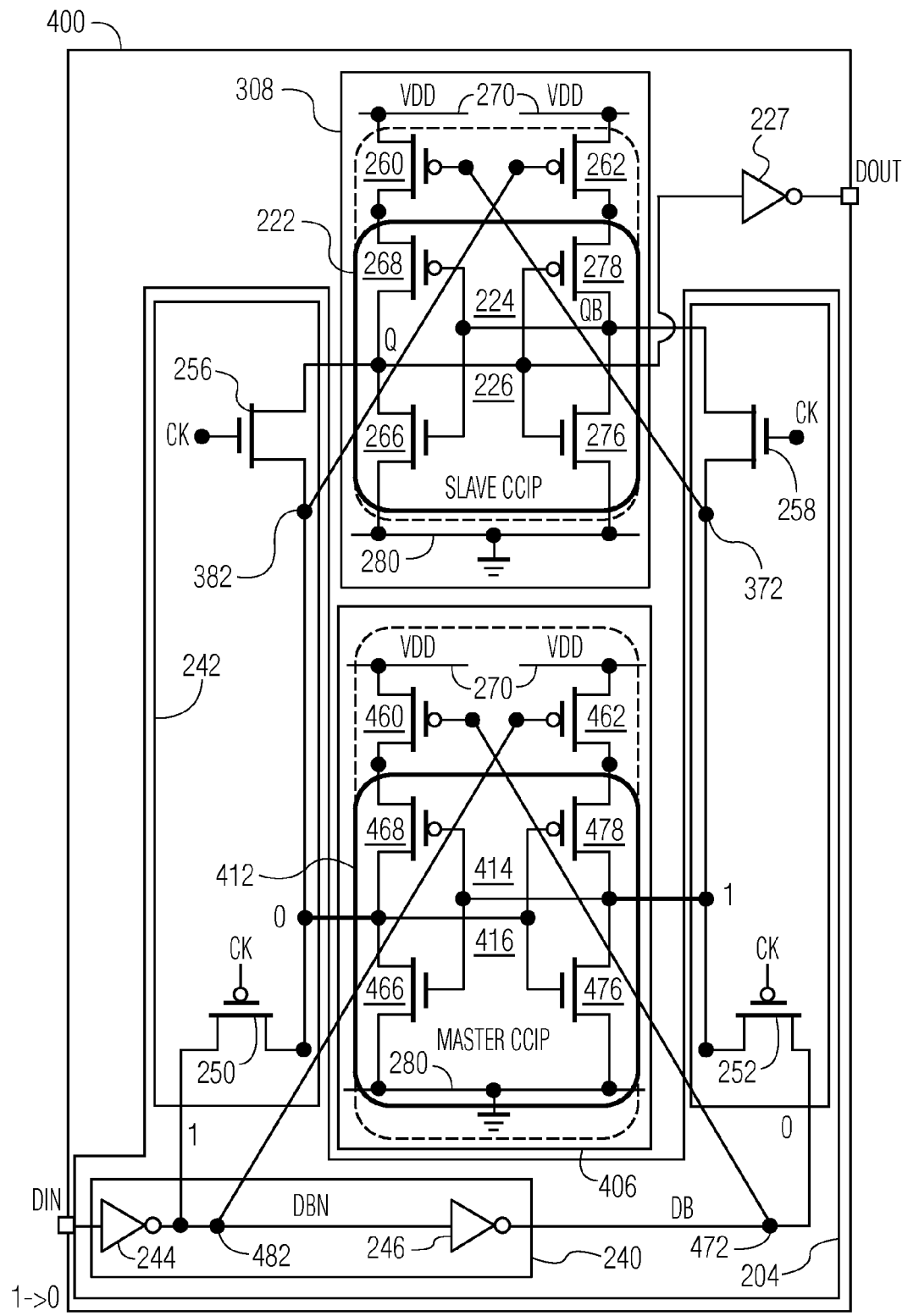
FIG. 5 shows the latch circuit of FIG. 4 with a low phase of a clock signal.
Figure 6:
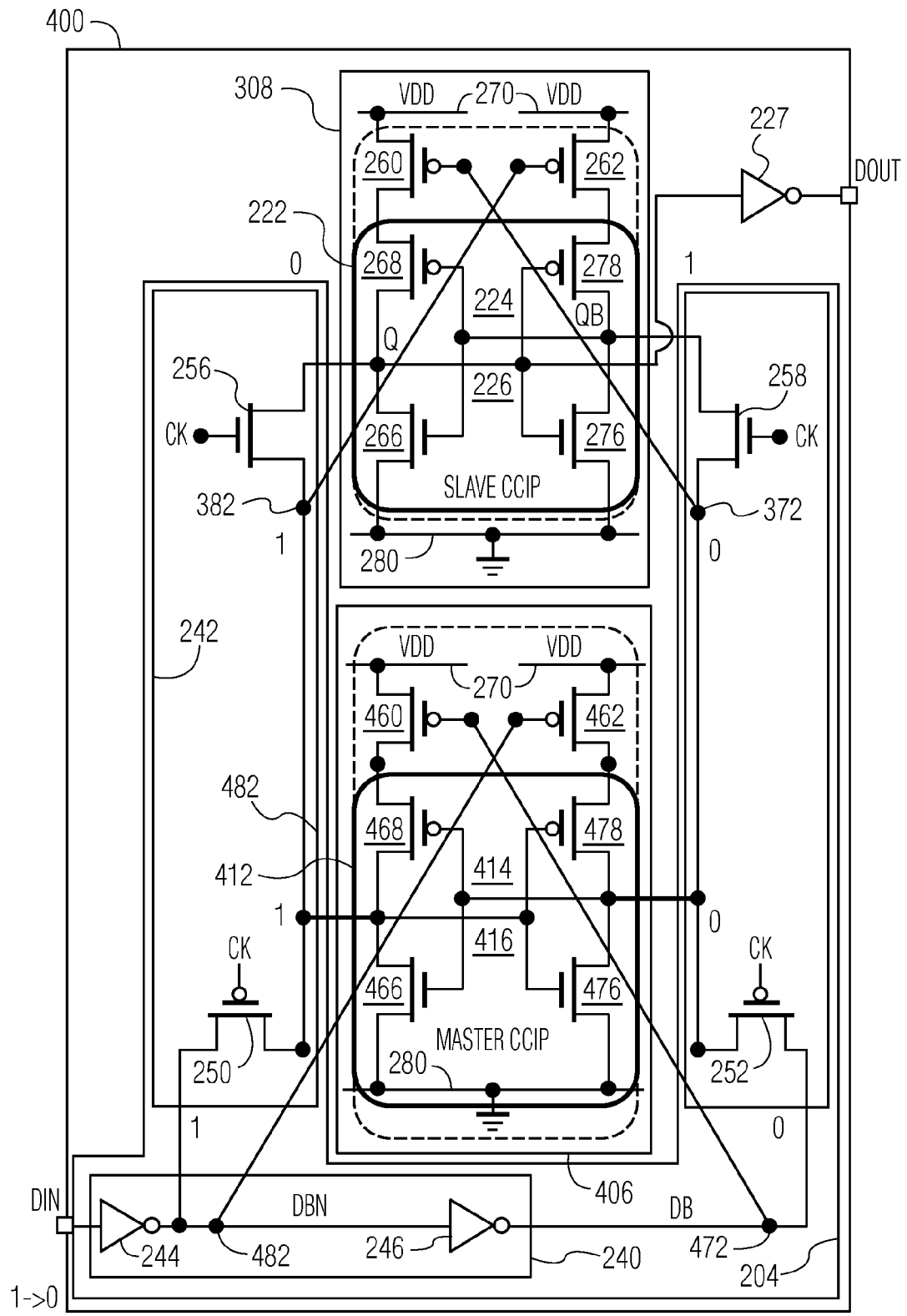
FIG. 6 shows the latch circuit of FIG. 4 with a rising edge of the clock signal.
Figure 7:
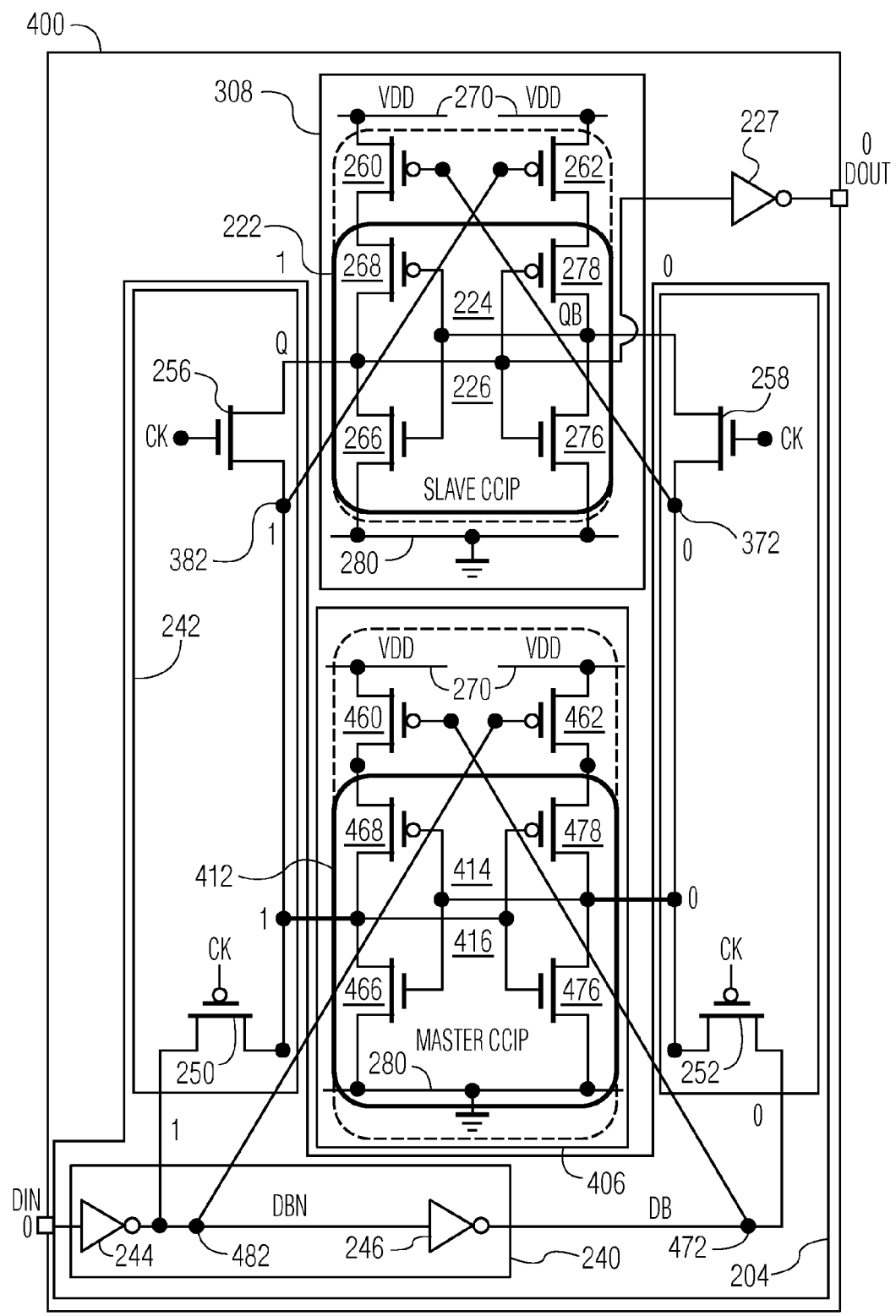
FIG. 7 shows the latch circuit of FIG. 4 in an active hold state.

Some examples of operation of the latch circuit 400 depicted in FIG. 4 are described with respect to signal value transitions labeled in FIGS. 5-7. Specifically, FIG. 5 shows the latch circuit of FIG. 4 with a low phase of the clock signal, "CK." In the embodiment depicted in FIG. 5, the input data at the input terminal, "DIN," transitions from "1" to "0." Because of the inverters 244, 246, signals at the PMOS transistors 250, 252 are "1" and "0," respectively. The transition of the input data turns off the PMOS transistor 462, which is stacked to the inverter 416 holding the logic value "1," and facilitates overpowering of the master CCIP data.

FIG. 6 shows the latch circuit 400 of FIG. 4 with a rising edge of the clock signal, "CK." In the embodiment depicted in FIG. 6, the transition of the input data turns off the PMOS transistor 262, which is stacked to the inverter 226 holding "1," and facilitates overpowering of the slave CCIP data.

FIG. 7 shows the latch circuit 400 of FIG. 4 in an active hold state. In the embodiment depicted in FIG. 7, the output data at the output terminal, "DOUT," is at "0." The stacked PMOS transistors in the master CCIP and the slave CCIP limit the leakage current.

Figure 8:
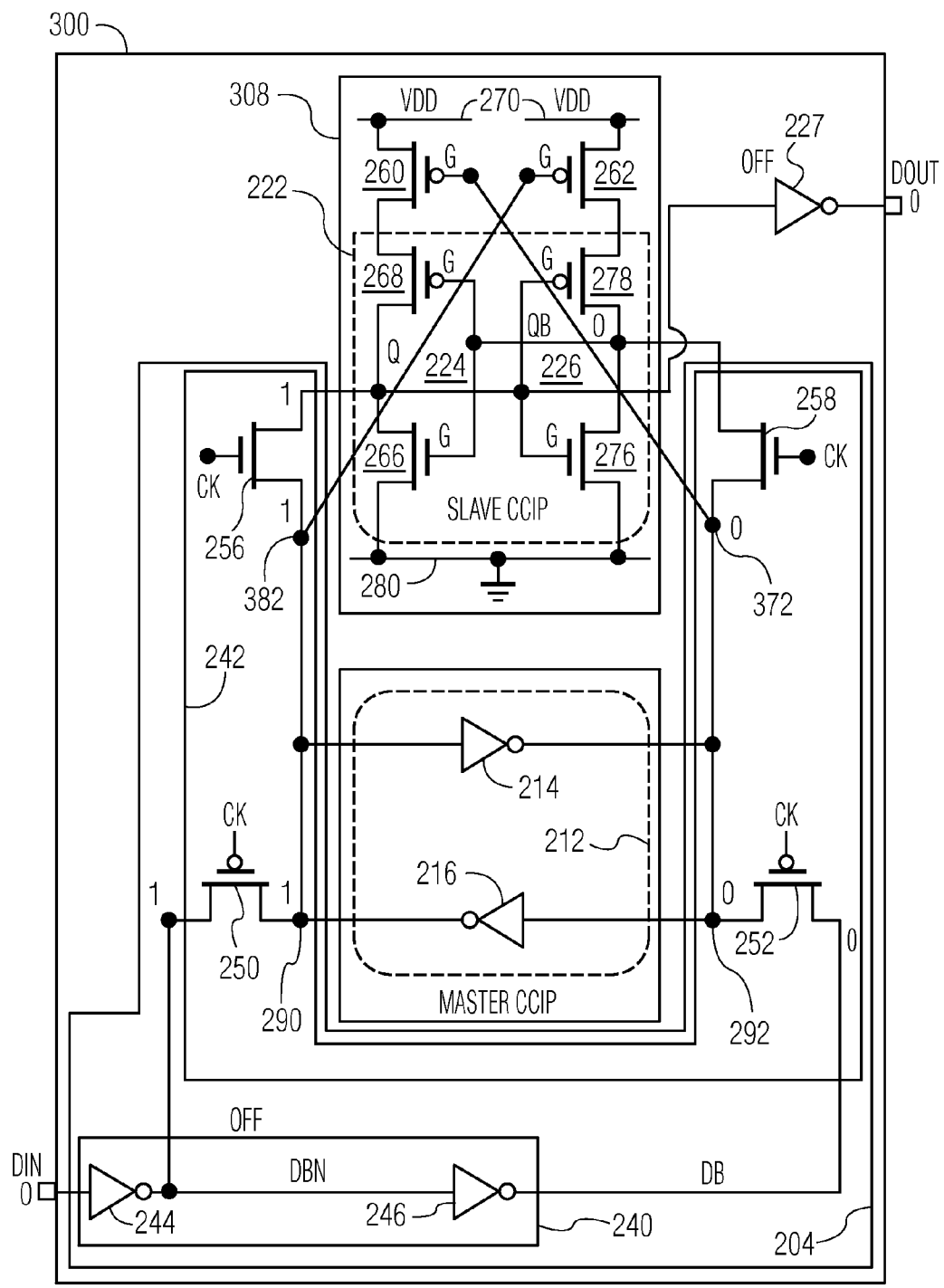
FIG. 8 shows the latch circuit of FIG. 3 in a retention state.

FIG. 8 shows the latch circuit 300 of FIG. 3 in a retention state. In the embodiment depicted in FIG. 8, the states of the slave CCIP 222 and the master CCIP 212 are retained. In the retention state, the output data at the output terminal, "DOUT," is at "0." The clock signal, "CK," is at logical high such that internal latch information from the input terminal, "DIN," is isolated as PMOS transistors 250, 252 are turned OFF. The redundancy (duplication) of stored states in the master CCIP and the slave CCIP provides an extra resilience against data flips risk during retention. The stacked OFF transistors (e.g., transistors 262, 278 the slave inverter circuit 308) helps to mitigate the leakage current. The latch circuit does not need extra control signals as used in balloon latch type retention flip flop circuits.

Figure 9:
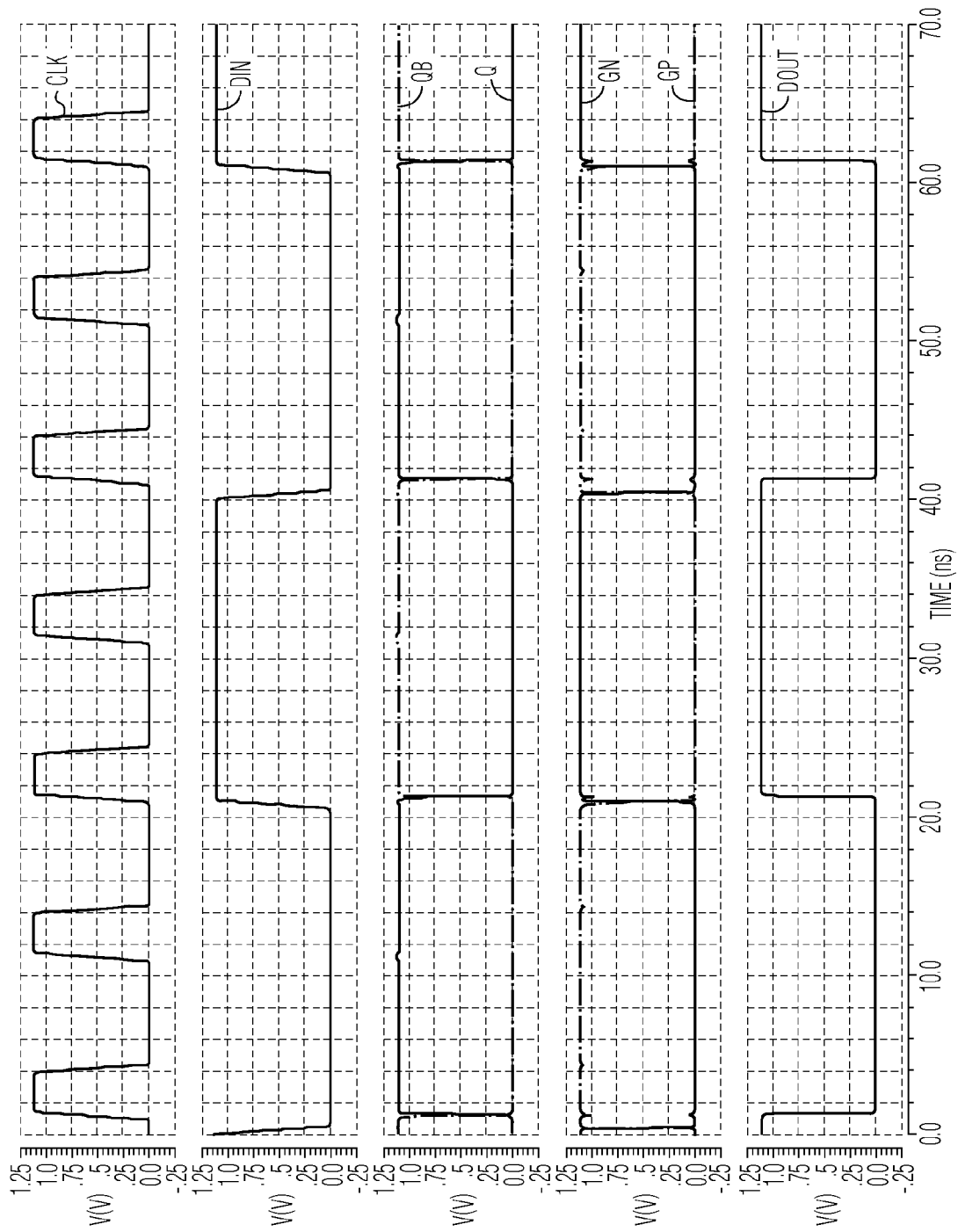
FIG. 9 illustrates some examples of signals of the latch circuits depicted in FIG. 3 and FIG. 4.

FIG. 9 illustrates an example of signals of the latch circuits 300, 400 depicted in FIG. 3 and FIG. 4. In the embodiment depicted in FIG. 9, the clock input, "CLK," the data input at the terminal, "DIN," the data output at the terminal, "DOUT", the input at node, "Q," and the inverted input at node, "QB," to the slave CCIP, and the input at node, "GP," and inverted input at node, "GN," to the master CCIP are shown. The internal nodes of the latch circuits, (e.g., GP, GN, QB, Q) are discharged or charged only when the input data received at the input terminal, "DIN," is different for consecutive clock cycles of the clock signal, "CK."

Figure 10:
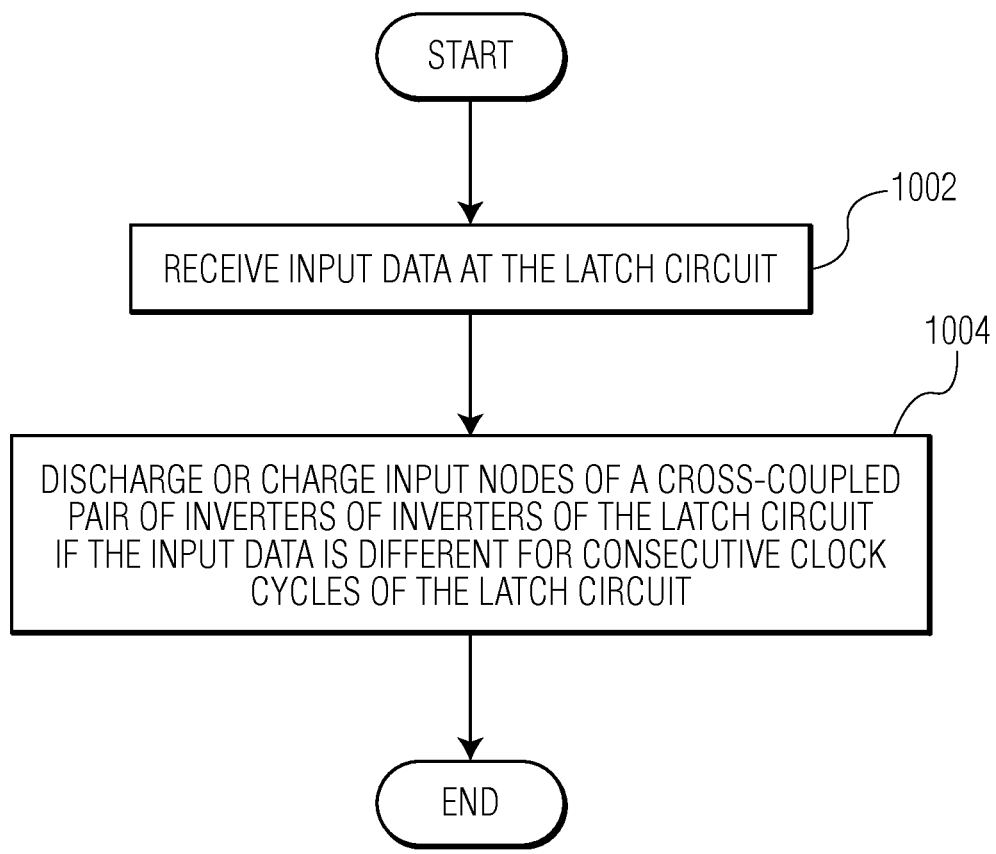
FIG. 10 is a process flow diagram that illustrates a method for operating a latch circuit in accordance with an embodiment of the invention.

FIG. 10 is a process flow diagram that illustrates a method for operating a latch circuit in accordance with another embodiment of the invention. The latch circuit may be, for example, the same as or similar to the latch circuit 100 depicted in FIG. 1, the latch circuit 200 depicted in FIG. 2, the latch circuit 300 depicted in FIG. 3, and/or the latch circuit 400 depicted in FIG. 4. At block 1002, input data is received at the latch circuit. At block 1004, input nodes of a cross-coupled pair of inverters of the latch circuit are discharged or charged if the input data is different for consecutive clock cycles of the latch circuit.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A latch circuit, comprising:
   an input terminal configured to receive an input data signal;
   a switching unit configured to control application of the input data signal;
   a first inverter circuit connected to the switching unit, wherein the first inverter circuit comprises a first cross-coupled pair of inverters; and a second inverter circuit connected to the first inverter circuit through the switching unit, wherein the second inverter circuit comprises:
  a second cross-coupled pair of inverters; and
  two transistor devices, wherein each inverter of the second cross-coupled pair of inverters is connected to a voltage rail through a corresponding transistor device of the two transistor devices, and wherein each of the two transistor devices is connected to a node that is between the switching unit and the first inverter circuit or the second inverter circuit.

2. The latch circuit of claim 1, wherein gate terminals of the two transistor devices are cross-connected to nodes between two switches of the switching unit and the second cross-coupled pair of inverters.

3. The latch circuit of claim 1, wherein gate terminals of the two transistor devices are cross-connected to nodes between two switches of the switching unit and the first cross-coupled pair of inverters.

4. The latch circuit of claim 1, wherein the two transistor devices comprise two PMOS transistors.

5. The latch circuit of claim 1, wherein the first inverter circuit further comprises:
  two transistor devices, wherein each inverter of the first cross-coupled pair of inverters is connected to the voltage rail through a corresponding transistor device, and wherein gate terminals of the two transistor devices of the first inverter circuit are cross-connected to nodes within the switching unit.

6. The latch circuit of claim 5, wherein the two transistor devices of the first inverter circuit comprise two PMOS transistors.

7. The latch circuit of claim 1, wherein each of the two transistor devices comprises a PMOS transistor connected to a high voltage rail and to a corresponding inverter of the second cross-coupled pair of inverters.

8. The latch circuit of claim 1, wherein each inverter of the second inverter circuit comprises an NMOS transistor and a PMOS transistor connected in series with each other, and where gate terminals of the NMOS transistor and the PMOS transistor are connected to the switching unit.

9. The latch circuit of claim 1, wherein the switching unit is configured to control the application of the input data signal to the first cross-coupled pair of inverters and to the second cross-coupled pair of inverters.

10. The latch circuit of claim 1, wherein the switching unit comprises:
  a third inverter circuit configured to generate an inverted version of the input data signal and a non-inverted version of the input data signal; and
  a switching module configured to switch one of the inverted and non-inverted versions of the input data signal to an input terminal of the first cross-coupled pair of inverters or the second cross-coupled pair of inverters and to switch the other one of the inverted and non-inverted versions of the input data signal to an output terminal of the first cross-coupled pair of inverters or the second cross-coupled pair of inverters.

11. The latch circuit of claim 10, wherein the third inverter circuit comprises:
  a first inverter connected to the input terminal and configured to generate the inverted version of the input data signal; and
  a second inverter configured to generate the non-inverted version of the input data signal.

12. The latch circuit of claim 10, wherein the switching module comprises:
  a first set of switches configured to switch one of the inverted and non-inverted versions of the input data signal to an input terminal of the first cross-coupled pair of inverters and to switch the other one of the inverted and non-inverted versions of the input data signal to an output terminal of the first cross-coupled pair of inverters; and
  a second set of switches configured to switch one of the inverted and non-inverted versions of the input data signal to an input terminal of the second cross-coupled pair of inverters and to switch the other one of the inverted and non-inverted versions of the input data signal to an output terminal of the second cross-coupled pair of inverters.

13. The latch circuit of claim 12, wherein the first set of switches comprises transistors of a first polarity type, and the second set of switches comprises transistors of a second, opposite, polarity type.

14. The latch circuit of claim 12, wherein the first set of switches comprises PMOS transistors, and the second set of switches comprises NMOS transistors.

15. The latch circuit of claim 12, further comprising an output terminal connected to the switching unit and the second inverter circuit and configured to output an output data signal in response to the input data signal.

16. A latch circuit, comprising:
  an input terminal configured to receive an input data signal;
  a switching unit comprising:
    a first inverter configured to generate an inverted version of the input data signal from the input data signal;
    a second inverter connected to the first inverter and configured to generate a non-inverted version of the input data signal;
    a first set of switching transistors of a first polarity type, wherein the first set of switching transistors are connected to the first and second inverters; and
    a second set of switching transistors of a second, opposite, polarity type;
  a first inverter circuit connected to the first and second sets of switching transistors, wherein the first inverter circuit comprises a first cross-coupled pair of inverters; and
  a second inverter circuit connected to the first inverter circuit through the second set of switching transistors, wherein the second inverter circuit comprises:
    a second cross-coupled pair of inverters; and
    two transistor devices, wherein each inverter of the second cross-coupled pair of inverters is connected to a low voltage rail and to a high voltage rail through a corresponding transistor device of the two transistor devices, wherein gate terminals of the two transistor devices are cross-connected to drain terminals or source terminals of the second set of switching transistors.

17. The latch circuit of claim 16, wherein the gate terminals of the two transistor devices are cross-connected to the second cross-coupled pair of inverters.

18. The latch circuit of claim 16, wherein the gate terminals of the two transistor devices are cross-connected to the first cross-coupled pair of inverters.

19. The latch circuit of claim 16, wherein the first inverter circuit further comprises:
  two transistor devices for connecting the first cross-coupled pair of inverters to the high voltage rail.

20. A method for operating a latch circuit, the method comprising:
  receiving input data at the latch circuit, wherein the latch circuit comprises:
    an input terminal configured to receive an input data signal;
    a switching unit configured to control application of the input data signal;
    a first inverter circuit connected to the switching unit, wherein the first inverter circuit comprises a first cross-coupled pair of inverters; and
    a second inverter circuit connected to the first inverter circuit through the switching unit, wherein the second inverter circuit comprises:
      a second cross-coupled pair of inverters; and
      two transistor devices, wherein each inverter of the second cross-coupled pair of inverters is connected to a voltage rail through a corresponding transistor device of the two transistor devices, and wherein each of the two transistor devices is connected to a node that is between the switching unit and the first inverter circuit or the second inverter circuit; and
  discharging or charging input nodes of one of the first and second cross-coupled pairs of inverters of the latch circuit if the input data is different for consecutive clock cycles of the latch circuit.

* * * * *